(12) United States Patent
Tiemeijer

(10) Patent No.: US 10,522,323 B2
(45) Date of Patent: Dec. 31, 2019

(54) ELECTRON ENERGY LOSS SPECTROSCOPY WITH ADJUSTABLE ENERGY RESOLUTION

(71) Applicant: FEI Company, Hillsboro, OR (US)

(72) Inventor: Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/946,177

(22) Filed: Apr. 5, 2018

(65) Prior Publication Data

US 2019/0311880 A1    Oct. 10, 2019

(51) Int. Cl.
| | | |
|---|---|---|
| H01J 37/26 | (2006.01) | |
| G01N 23/04 | (2018.01) | |
| H01J 37/24 | (2006.01) | |
| H01J 37/285 | (2006.01) | |

(52) U.S. Cl.
CPC .......... *H01J 37/243* (2013.01); *H01J 37/265* (2013.01); *H01J 37/285* (2013.01); *H01J 2237/063* (2013.01); *H01J 2237/2813* (2013.01)

(58) Field of Classification Search
CPC ............. H01J 37/26; H01J 2237/24485; H01J 2237/2442; H01J 37/073; H01J 2237/05; H01J 2237/063; H01J 37/285; G01N 23/225; G01N 23/04
USPC ...................... 250/307, 311, 305, 310, 396 R
See application file for complete search history.

(56) References Cited

U.S. PATENT DOCUMENTS

| | | | |
|---|---|---|---|
| 6,794,648 B2 * | 9/2004 | Kaji ................. | G01N 23/04 250/305 |
| 7,459,680 B2 * | 12/2008 | Kaneyama .......... | H01J 37/05 250/305 |
| 9,601,310 B2 * | 3/2017 | Moers ................ | H01J 37/02 |
| 9,984,852 B1 * | 5/2018 | Luiten ............... | H01J 37/20 |
| 2008/0290287 A1 * | 11/2008 | David ................ | H01J 49/025 250/396 R |
| 2009/0081549 A1 * | 3/2009 | Liaw ................. | H01M 4/364 429/222 |
| 2010/0072366 A1 * | 3/2010 | Tiemeijer ........... | H01J 37/153 250/307 |
| 2010/0108882 A1 * | 5/2010 | Zewail .............. | H01J 37/22 250/307 |
| 2011/0278451 A1 * | 11/2011 | Tiemeijer ........... | H01J 37/05 250/307 |
| 2012/0049060 A1 * | 3/2012 | Luecken ............ | H01J 37/05 250/305 |

(Continued)

*Primary Examiner* — David A Vanore

(57) ABSTRACT

Adjustable resolution electron energy loss spectroscopy methods and apparatus are disclosed herein. An example method includes operating an electron microscope in a first state, the first state including operating a source of the electron microscope at a first temperature, obtaining, by the electron microscope, a first EELS spectrum of a sample at a first resolution, the first resolution based on the first temperature, operating the electron microscope in a second state, the second state including operating the source of the electron microscope at a second temperature, the second temperature different than the first temperature, and obtaining, by the electron microscope, a second EELS spectrum of the sample at a second resolution, the second resolution based on the second temperature, wherein the second resolution is different than the first resolution.

20 Claims, 5 Drawing Sheets

(56) References Cited

U.S. PATENT DOCUMENTS

| | | | |
|---|---|---|---|
| 2012/0199756 A1* | 8/2012 | Buijsse | H01J 37/26 |
| | | | 250/396 R |
| 2012/0237138 A1* | 9/2012 | Potapov | G01N 23/225 |
| | | | 382/294 |
| 2013/0062520 A1* | 3/2013 | Henstra | H01J 37/153 |
| | | | 250/311 |
| 2016/0027609 A1* | 1/2016 | Sharma | H01J 7/226 |
| | | | 250/307 |
| 2016/0071689 A1* | 3/2016 | de Jong | H01J 37/28 |
| | | | 250/307 |
| 2016/0086762 A1* | 3/2016 | de Jong | H01J 37/05 |
| | | | 250/305 |
| 2016/0111247 A1* | 4/2016 | Potocek | H01J 37/21 |
| | | | 250/307 |
| 2017/0146787 A1* | 5/2017 | Reed | G02B 21/365 |
| 2017/0243713 A1* | 8/2017 | Kieft | H01J 37/045 |
| 2018/0151326 A1* | 5/2018 | Kieft | H01J 37/045 |
| 2018/0301315 A1* | 10/2018 | Mukai | H01J 37/153 |
| 2018/0308659 A1* | 10/2018 | Yamazawa | H01J 37/20 |
| 2019/0096626 A1* | 3/2019 | Kohno | H01J 37/073 |
| 2019/0096627 A1* | 3/2019 | Ruan | H01J 37/073 |

\* cited by examiner

ELECTRON ENERGY LOSS SPECTROSCOPY WITH ADJUSTABLE ENERGY RESOLUTION

FIELD OF THE INVENTION

Generally disclosed herein are techniques for imaging using scanning transmission charged particle microscopy, and more specifically, techniques for reducing Coulomb interactions in charged particle beams.

BACKGROUND OF THE INVENTION

Charged particle microscopes conventionally include an array of analytical instruments that allow for analysis for samples. The analytical instruments allow for, in general, imaging, elemental analysis, and physical characterization of samples. For example, secondary electrons emitted from a sample may be used to form an image of the sample, and x-rays emitted from a sample due to irradiation by electrons or ions are used for elemental analysis. For physical characterization, spectroscopic techniques may be used to measure various characteristics of a sample, such as band gap properties and phonon energies. One technique for performing the physical characterization includes electron energy loss spectroscopy (EELS). EELS may allow analysis of electrons over a range of energies after having passed through a sample, and peaks at various energies in the range may provide information about the sample. Conventional EELS may be limited in resolution. While previous attempts have been made to overcome such a limitation, those attempts have been either difficult to implement or not as successful as desired. As such, improvements to EELS resolution is desired.

BRIEF DESCRIPTION OF THE DRAWINGS

Like reference numerals refer to corresponding parts throughout the several views of the drawings.

DETAILED DESCRIPTION OF EMBODIMENTS

Figure 1:
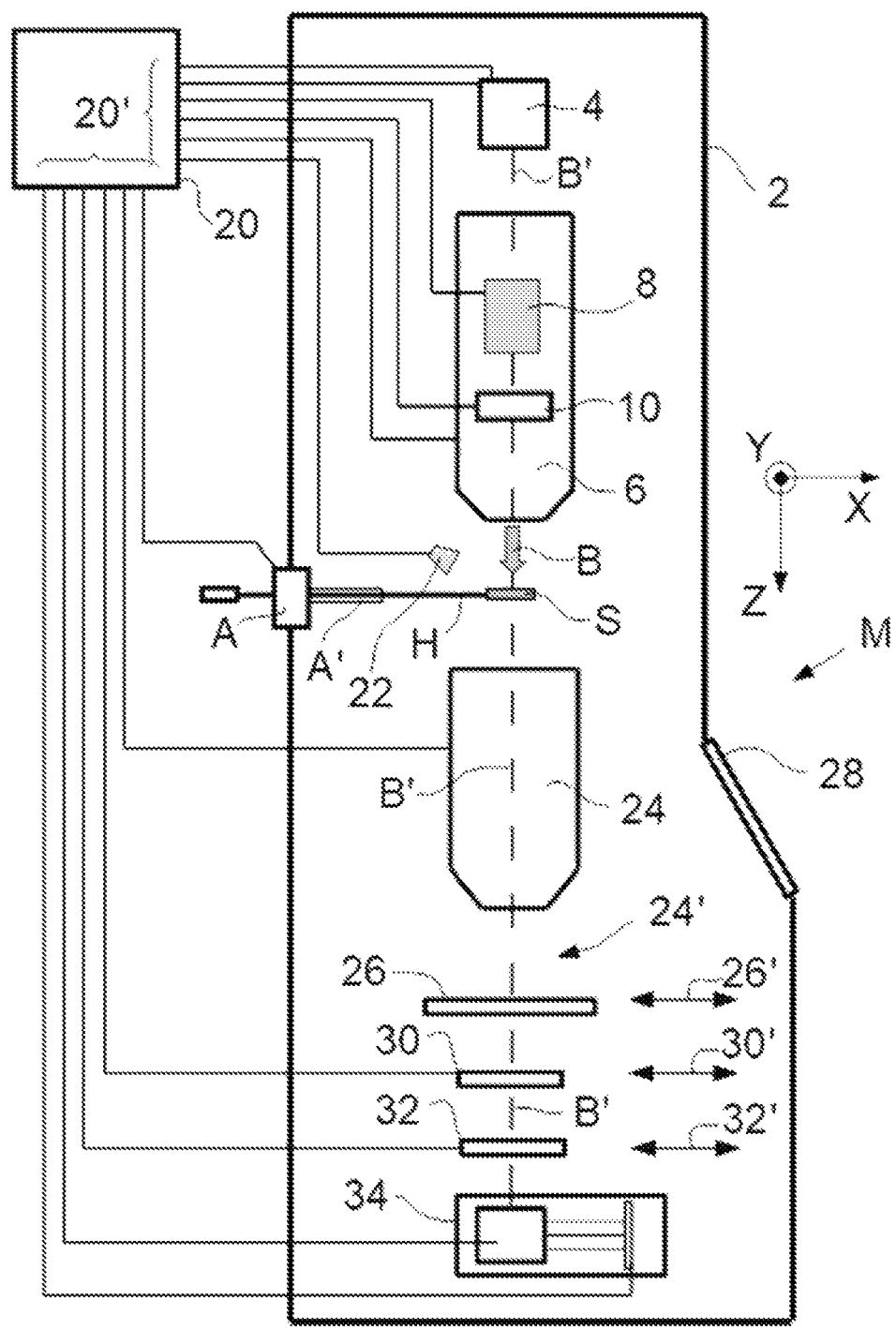
FIG. 1 illustrates a longitudinal cross-sectional elevation view of an embodiment of a (S)TEM in accordance with and embodiment of the present disclosure.

Embodiments of the present invention are described below in the context of a charged particle microscope, which may be a scanning transmission electron microscope for example. In some embodiments, changing an operating temperature of a source results in a change in the Coulomb forces that affect electron energy spread in an irradiating beam. By adjusting the source operating temperature up and down, the energy spread is affected higher and lower respectively. The changes in energy spread may allow the electron microscope to obtain EELS spectrums of different resolution resulting in measurement of intermediate features at higher resolutions. However, it should be understood that the methods described herein are generally applicable to a wide range of different spectroscopic techniques carried out in a charged particle microscope environment.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g., a FIB-SEM), which additionally employ a "machining" Focused Ion Beam (FIB), allowing supportive activities such as ion-beam milling or Ion-Beam-Induced Deposition (IBID), for example.

In an SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example.

One or more components of this emanating radiation is/are then detected and used for image accumulation purposes.

In a TEM, the electron beam used to irradiate the specimen is chosen to be of a high-enough energy to penetrate the specimen (which, to this end, will generally be thinner than in the case of an SEM specimen). The transmitted electrons emanating from the specimen can then be used to create an image. When such a TEM is operated in scanning mode (thus becoming an STEM), the image in question will be accumulated during a scanning motion of the irradiating electron beam.

An SEM can also be used in "transmission mode," e.g., when using relatively thin samples and a relatively high incident beam energy. Such a tool is often called a "TSEM" (Transmission SEM), and it will typically have a relatively rudimentary imaging system (e.g., a single lens and deflector) disposed between the specimen and post-specimen detector, which detector may comprise an Electron Energy Loss Spectroscopy (EELS) module.

It should be noted that, in addition to imaging, performing (localized) surface modification (e.g., milling, etching, deposition, etc.), and conducting spectroscopy, an electron microscope may also have other functionalities, such as examining diffractograms, studying ion channeling/ion backscattering (Rutherford Backscattering Spectrometry), etc.

In all cases, a transmission-type electron microscope (EM) (e.g., an S(TEM) or a TSEM) will comprise at least the following components: an electron source, an illuminator, a specimen holder, an imaging system, and a sensing device. The electron source may be one of a Cold Field Emission Gun (CFEG), Schottky electron source ("hot FEG"), thermionic source, etc., and provides electrons for the imaging medium. The illuminator serves to manipulate a "raw" radiation beam from the source and perform upon it certain operations such as focusing, aberration mitigation, cropping (with a diaphragm), filtering, etc. The illuminator will generally comprise one or more (charged-particle) lenses, and may comprise other types of (particle-)optical component as well. If desired, the illuminator can be provided with a deflector system that can cause its exiting charged particle beam to perform a scanning motion across the specimen being investigated. If desired—as is the case with the present disclosure—the illuminator may comprise a monochromator, which serves to narrow an energy spread of electrons sent toward the specimen. The monochromator may conventionally comprise a dispersion device (such as a Wien filter, for example) that allows selection of electrons within a selected energy range—e.g., so as to reduce or eliminate adverse effects of chromatic aberration on image quality, and/or to improve attainable resolution in an EELS measurement.

The specimen holder provides a platform for holding a specimen, and may position the specimen in response to control signals provided by a positioning system. The specimen holder may displace, rotate, and/or tilt the specimen, for example. If desired, the holder can be moved so as to effect scanning motion of the specimen with respect to the beam. When intended to hold cryogenic specimens, the specimen holder can be provided with a suitable cooling device.

The imaging system takes electrons that are transmitted through a specimen (plane) and directs (focuses) them onto a sensing device. As with the illuminator referred to above, the imaging system may also perform other functions, such as aberration mitigation, cropping, filtering, etc., and it will generally comprise one or more charged-particle lenses and/or other types of particle-optical components. And the sensing device, e.g., a detector, may be unitary or compound/distributed in nature, and can take many different forms, depending on what it is intended to sense. The detector may, for example, comprise one or more photodiodes, CMOS detectors, CCD detectors, photovoltaic cells, etc. The sensing device may be comprised in a sub-component such as an EELS module.

When an EELS module is present, it will generally comprise a dispersing device (e.g., comprising one or more "electron prisms") to disperse an incoming flux of electrons (from the imaging system) into an energy-resolved (continuous) array of spectral sub-beams, which can be directed onto a detection surface so as to form a spectrum. Basically, the incoming flux will contain electrons of various energies, and the dispersing device will "fan these out" (along a dispersion direction) into a (continuous) collection/array of sub-beams of given energies (in a manner somewhat reminiscent of a mass spectrometer).

An example of a microscope as disclosed herein may be an EM (e.g., a(n) (S)TEM or TSEM) that is provided with a (selectable) EELS module. EELS is a technique used in EMs to obtain elemental/chemical information pertaining to a given specimen. A moving electron in an irradiating beam (from the EM's illuminator) can transfer energy to a bound electron in a core shell of an atom in the specimen, and promote this core electron to an outer shell (i.e., inelastic scattering). This energy transfer from the moving electron gives rise to what is referred to as a "Core Loss Peak" (CLP) in the EELS spectrum. The (coarse) position (in energy units) of the CLP is element-specific, and its precise position and shape are specific to the element's chemical environment and bonding.

An EELS spectrum may also include, in addition to CLPS, a Zero Loss Peak (ZLP) and intermediate features. The ZLP corresponds to electrons from the irradiating beam that have traversed the specimen without (substantial) energy loss. And the intermediate features, which may be between the CLP and ZLP, may include "Plasmon Resonance Peaks" (PRPs). The PRPS are a relatively broad series of peaks/shoulders associated with single or multiple scattering of electrons on plasmons in the specimen. These PRPs typically lay in the energy range 0-50 eV. Other examples of intermediate features include phonon resonances and band gap features (intensity discontinuities), for example.

Conventionally, EELS modules can also be used as energy-selective imaging devices (EFTEMs: Energy-Filtered TEMs). To achieve this, they employ a slit ("letterbox") at/proximal their (primary) spectrum plane. When the module is used as a pure spectrometer, this slit is retracted, and the spectrum plane can be magnified and imaged onto the employed detector (camera) using post-dispersion optics. On the other hand, when the module is used as an energy-selective imaging device, the slit can be invoked to pass/admit only a specific energy window (typically of the order of 10-50 eV wide); in that case, the post-dispersion (post-slit) optics then image a Fourier Transform plane of said spectrum plane onto the detector. Although known EELS techniques have produced acceptable results up to now, the present inventor has sought to improve them further. The results of this endeavor are the subject of the present disclosure.

Accordingly, it is an object of the invention to provide an EELS method/apparatus that is versatile in its ability to (optimally) examine different regions/features of an EELS spectrum. These and other objects are achieved by a technique that at least includes selecting a first operating temperature T1 of a source in a first use session, and examining an EELS spectrum at a first resolution R1, and selecting a second, different operating temperature T2 of the source in a second use session, and examining an EELS spectrum at a second, different resolution R2. The resolutions R1 and R2 are different due to the associated source currents. Because changes in source current affect the Coulomb interactions, which affects beam energy spread, the resolution of the incident beam can be adjusted. For example, a high beam current (due to a high operating temperature) increases the Coulomb forces, which increase beam energy spread. An increased beam energy spread may reduce the associated resolution. On the other hand, a low beam current (due to a low operating temperature) decreases Coulomb forces, which decreases beam energy spread. A decreased beam energy spread may increase the associated resolution. As such, in the above example, R1 will be less than R2.

It should be explicitly noted that each of the first and second use sessions may entail analysis of the same specimen, a different specimen, or a different part of a specimen; moreover, the first and second use sessions may be separated by any desired temporal interval, do not have to be consecutive, and their order may be reversed, if desired. In addition, it should be realized that examining an EELS spectrum as referred to herein may, if so desired, entail acquisition/analysis of only a confined region of the spectrum The mechanisms underlying the present disclosure can be explained as follows: because of the typically low intensity of CLPs, it is generally desirable that the employed monochromatized source deliver a relatively high (ideally maximal) incident beam current, so as to avoid an excessively long acquisition time (to record a CLP region of a spectrum). This also generally applies when a monochromator is not employed.

Recent years have shown a steady increase in interest in the use of EELS to map the abovementioned intermediate features (e.g., plasmons, phonons, and band gaps, etc.) in specimens (typical energy loss 0.05-5 eV, with typical resolution 0.005-0.030 eV). Since the intermediate feature signal is generally relatively strong, this type of "Ultra-High Resolution" (UHR) EELS typically does not require maximal/large probe current. Instead, it is important that the ZLP—on whose flank the intermediate features are typically seated—should have relatively low (ideally minimal) width, with a relatively short (ideally minimal) "tail" (in a graph of intensity versus energy loss, the tail of the ZLP is the fall-off from peak intensity as a function of increasing energy loss).

It has been found that the tail of the ZLP is mostly determined by Coulomb interactions in the incident beam, and especially by Coulomb interactions occurring in the vicinity of source and monochromator (see the explanation below).

One way to reduce Coulomb interactions is to reduce the beam current by employing a relatively small entrance aperture in the monochromator. However, this is an unfavorable solution, because it would also undesirably reduce the attainable beam current for CLPs. Such current reduction could be mitigated by using a variable entrance aperture in the monochromator, but this solution tends to significantly complicate the construction, since the entrance aperture must operate in a high-tension and ultra-high vacuum environment. A more fundamental issue with adjustment of the entrance aperture is that it only addresses Coulomb interactions occurring after the aperture while the Coulomb interactions that occur in the region between the source and aperture are not mitigated by such an aperture.

In an alternative approach, the present disclosure uses the operating temperature of the electron source as a variable to adjust the beam current, and thereby influence Coulomb interactions. As a general rule of thumb: a higher operating temperature will tend to give a higher beam current and lower energy resolution, whereas a lower operating temperature will tend to give a lower beam current and higher energy resolution.

As disclosed herein, adjustments to the source operating temperature can be made manually (e.g., by selecting particular values in a user interface menu, or turning a (real or virtual) "knob"), automatically (e.g., by a controller/processor that is configured/programmed to autonomously select a given operating temperature value dependent on the type of spectral analysis being performed—for instance, as indicated in a user interface menu/batch recipe), or using a hybrid manual/autonomous approach.

In a particular embodiment of the invention, T1 is selected to be in a range of 1700-1900 degrees Kelvin, and T2 is selected to be in a range of 1400-1500 degrees Kelvin, (or vice versa).

Taking a Schottky FEG as a specific example of a thermal source, its nominal operating temperature is ca. 1800 Kelvin. Conventional wisdom would point away from using a lower operating temperature, because a lower temperature may lead to excessive contamination build-up on the source tip. At a lower operating temperature of, for example, 1400-1500 Kelvin, increased contamination of the source tip has been observed. However, after a relatively short "settlement" time interval—e.g., of the order of ca. 30 minutes—a new equilibrium establishes itself, and that contamination built-up stabilizes, meaning that the source can be successfully/satisfactorily operated at such temperatures regardless of the contamination. Choosing T2 to be in this range drastically reduces the aforementioned Coulomb interactions, with an attendant significant improvement in attainable energy resolution. Whereas a T1 value in the range 1700-1900 K typically results in an energy resolution R1 in the range 30-50 meV (millielectron Volts), choosing T2 to be in the range of 1400-1500 K can produce an energy resolution R2 of less than 20 meV (e.g., 10-15 meV)—representing an improvement of about a factor of two, or better. Of course, the disclosure is not limited to these values, and an operating temperature of ca. 1600K can be used, if desired. However, the specific ranges of T1, T2 (and the corresponding R1, R2) quoted above are important in that they typically represent very suitable values for respectively detecting CLPs (at T1/R1) and intermediate features (at T2/R2).

It should be noted that the usefulness/applicability of the disclosed technique is not limited to high-resolution EELS. In addition/alternatively, it should be realized that it generally allows for low-chromatic-aberration imaging, for example.

FIG. 1 is a highly schematic depiction of an embodiment of a(n) (S)TEM M in which the disclosed techniques are implemented (though, in the context of the present disclosure, it could alternatively be a TSEM). In the Figure, within a vacuum enclosure 2, a thermal electron source 4—such as a Schottky FEG—produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 10, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed. For example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction), and/or allows scanning motion to be performed as an alternative to beam scanning. If desired, an optional cooling device (not depicted) can be brought into intimate contact with the specimen holder H, so as to maintain it (and the specimen S thereupon) at cryogenic temperatures, for example.

Of particular importance in the illuminator 6 is the monochromator 8. The source 4 radiates rays (electron paths) in a variety of directions, and these rays pass into a disperser/particle prism (not depicted) in the monochromator 8, where dispersion occurs, i.e. a differential deflection that depends on the exact energy of the particle passing along a given nominal path/ray, which causes a spectral spread in the various rays. A monochromator slit (not depicted) is used to select a relatively narrow sub-section of this spectral spread, thus passing only a selected energy range. This monochromator slit may, for example, be set at ground potential, which facilitates the construction of the slit; alternatively, the monochromator slit can, for example, be positioned in or proximal to the dispersive element of the monochromator.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance. In such a case, an image could be constructed using basically the same principle as in an SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In non-scanning TEM mode, the imaging system 24 can focus the transmitted electron flux onto a fluorescent screen (sensing device) 26, which, if desired, can be retracted/withdrawn (as schematically indicated by arrows 26') so as to get it out of the way of axis B'. An image or diffractogram of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image/diffractogram on screen 26, one can instead make use of the fact that the depth of focus of the electron flux leaving imaging system 24 is generally quite large (e.g., of the order of 1 meter). Consequently, various other types of sensing device can be used downstream of screen 26, such as TEM camera 30, STEM camera 32, or spectroscopic apparatus 34.

At TEM camera 30, electron flux B" can form a static image or diffractogram that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

An output from STEM camera 32 can be recorded as a function of (X,Y) scanning position of the beam B on the specimen S, and an image can be constructed that is a "map" of output from STEM camera 32 as a function of X,Y. STEM camera 32 can comprise a single pixel with a diameter of e.g., 20 mm, as opposed to the matrix of pixels characteristically present in TEM camera 30. Moreover, STEM camera 32 will generally have a much higher acquisition rate (e.g., 106 points per second) than TEM camera 30 (e.g., 102 images per second). Once again, when not required, STEM camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, spectroscopic apparatus 34 may also be invoked, which is an EELS module in the present embodiment. It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. The controller 20 can provide a variety of functions, such as synchronizing actions, providing setpoints, processing signals, performing calculations, and displaying messages/information on a display device (not depicted). Of course, the (schematically depicted) controller 20 may be (partially) inside or outside the enclosure 2, and may have a unitary or composite structure, as desired.

In some embodiments, the interior of the enclosure 2 does not have to be kept at a strict vacuum. For example, in an "Environmental TEM/STEM," a background atmosphere of a given gas is deliberately introduced/maintained within the enclosure 2. In such an embodiment, it may be advantageous to confine the volume of enclosure 2 so that, where possible, it essentially hugs the axis B', taking the form of a small tube (e.g., of the order of 1 cm in diameter) through which the employed electron beam passes, but widening out to accommodate structures such as the source 4, specimen holder H, screen 26, camera 30, camera 32, spectroscopic apparatus 34, etc.

Figure 2:
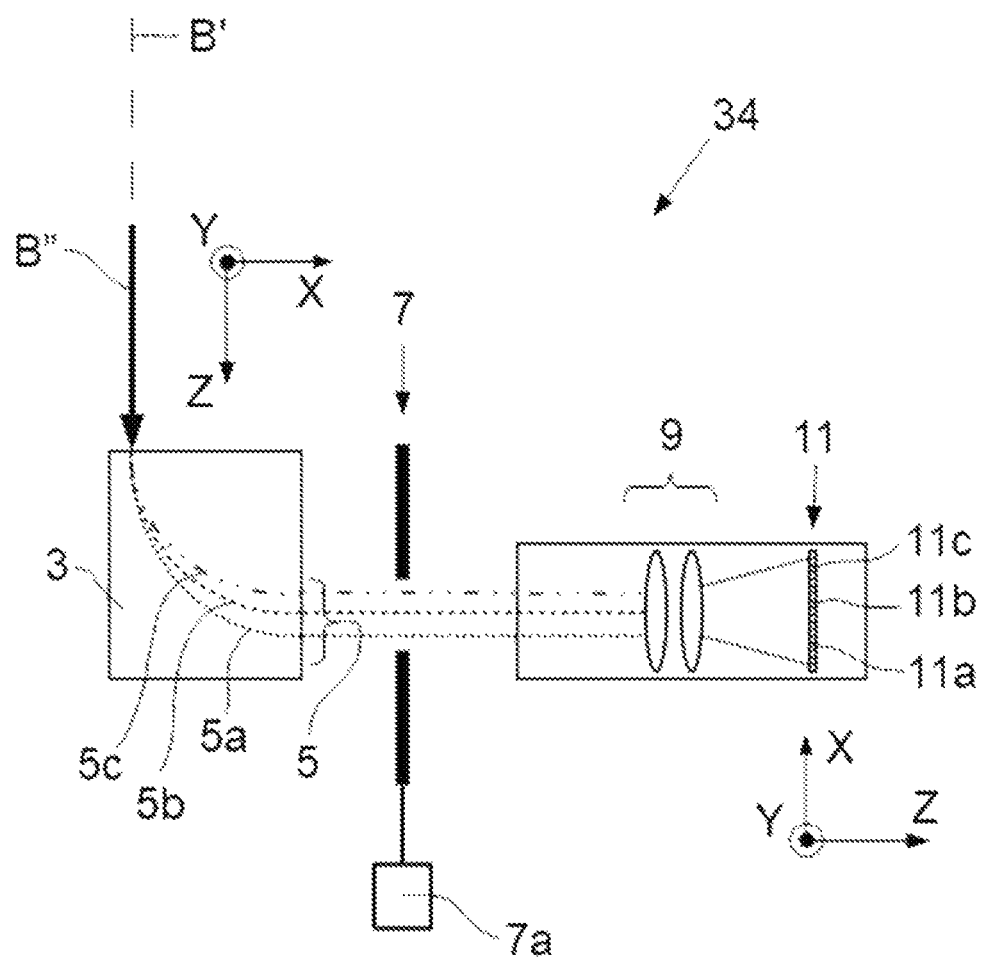
FIG. 2 is an enlarged and more detailed view of an EELS module in accordance with an embodiment of the present disclosure.

Turning now to FIG. 2, which shows an enlarged and more detailed view of the spectroscopic apparatus (EELS module) 34 of FIG. 1. In FIG. 2, flux B" of electrons (which has passed through specimen S and imaging system 24) is shown propagating along electron-optical axis B'. The flux B" enters a dispersing device 3 ("electron prism"), where it is dispersed (fanned out) into an energy-resolved/energy-differentiated (continuous) array 5 of spectral sub-beams (schematically indicated in FIG. 2 using broken lines), which are distributed along dispersion direction X. For illustration purposes, three of these sub-beams are labelled 5a, 5b and 5c in FIG. 2. Note in this regard that, conventionally, propagation is considered to occur along the Z direction, and the depicted Cartesian coordinate system thus "co-deflects with" the flux B" within the dispersing device 3.

Downstream of item 3, the array 5 of sub-beams encounters an adjustable/retractable slit (letterbox) 7, which can, for example, be used in EFTEM-mode to select/admit a given portion of the array 5 and to discard/occlude other portions thereof. Accordingly, the slit 7 is connected to an actuation device 7a that can be invoked to open/close/move the (opening in the) slit 7 as desired. In EELS mode, the slit 7 is usually (fully) open/retracted. In some embodiments, the slit 7 is advantageously disposed at a location at or proximal to a dispersion plane of the spectroscopic apparatus 34. Similarly, the detector 11 is also advantageously located at or proximal to such a plane. If desired, it is possible to aim/shift the array 5 of spectral sub-beams falling upon the slit 7 by appropriately adjusting, for example, (an electrical signal to) the dispersing device 3 and/or a drift tube/deflector (not depicted) provided between the dispersing device 3 and slit 7, for instance.

After having traversed slit 7, the (selected portion of the) array 5 passes through post-dispersion electron optics 9, where it is magnified/focused, for example, and ultimately directed/projected onto detector 11, with sub-beams 5a, 5b and 5c respectively impinging upon detector portions 11a, 11b and 11c.

With regards to the technique discussed herein, the operating temperature of the source 4 can be adjusted, which may be achieved by altering the magnitude of an electrical current passed through a resistive heating element in/near an emission tip in the source 4. For example, in the case of a Schottky FEG, an emission tip is conventionally provided on a (tungsten) filament through which an electrical current can be passed. In a calibration experiment, it is possible to pre-compile a lookup table of tip temperature (e.g., measured using a pyrometer) versus electrical current through the filament (e.g., measured using an ammeter) allowing subsequent choice of a given operating temperature via appropriate selection of a filament current value. In this way, the technique disclosed herein includes at least a two part workflow. In some embodiments, the two parts include a first use session and a second use session where the two use sessions are implemented at different operating temperatures. For example, in the first use session, a first operating temperature T1 of the source 4 is selected, and at least part of an EELS spectrum is acquired/examined at a first resolution R1. The examination of CLPs at a source temperature of 1800K may be performed in the first use session. To continue the example, in the second use session, a second, different operating temperature T2 of the source 4 is selected, and at least part of an EELS spectrum is acquired/examined at a second, different resolution R2. Intermediate features—such as phonons, plasmons or band gaps—may be studied at a source temperature of 1450K in the second use session.

FIGS. 3A-3D show various aspects of the ZLPs of EELS spectra measured using the technique disclosed herein at various source (Schottky FEG) operating temperatures. All spectra were acquired with incident beam energy of 200 keV on a specimen comprising a carbon membrane on which particles of boron nitride were disposed. In each case, the horizontal axis shows energy in electron volts (eV), and the vertical axis shows intensity in arbitrary units. In the Figures outer peak T1 was acquired at a source operating temperature of 1800K, middle peak T2 was acquired at a source operating temperature of 1625 K, and inner peak T3 was acquired at a source operating temperature of 1450 K.

Figure 3A:
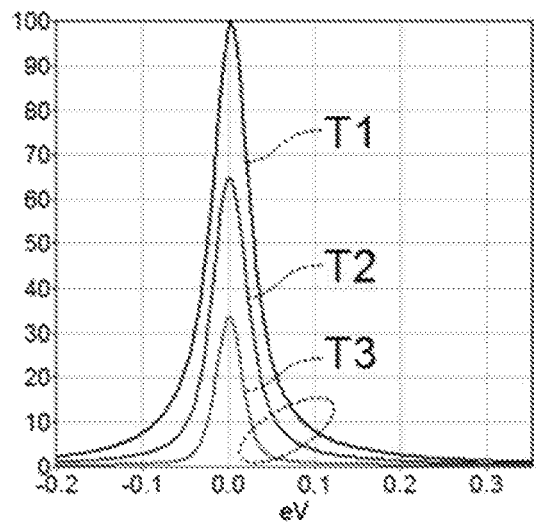
FIG. 3A shows the ZLP of EELS spectra measured using the present invention, at various source operating temperatures.

In FIG. 3A, peak T1 has a reference height of 100 units on the vertical scale, and the other peaks are to scale. It is seen that, as the source operating temperature decreases the ZLP gets progressively lower and narrower, and the tail of the ZLP becomes progressively curtailed/suppressed as shown by the dashed elliptical highlight on the lower right of the peaks.

Figure 3B:
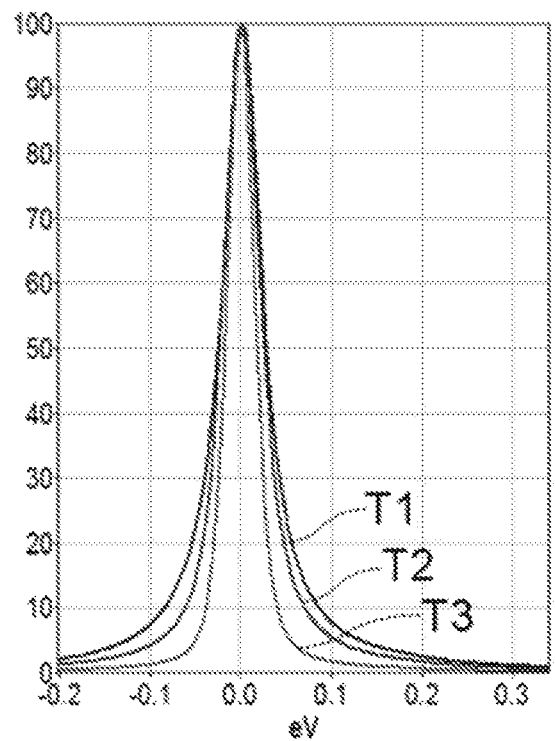
FIG. 3B corresponds to FIG. 3A, except that the various peaks are scaled so that their maxima mutually coincide.

In FIG. 3B, the heights of peaks T1, T2 and T3 have been scaled so that their maxima coincide, and the flanks of the peaks appear to be featureless.

Figure 3C:
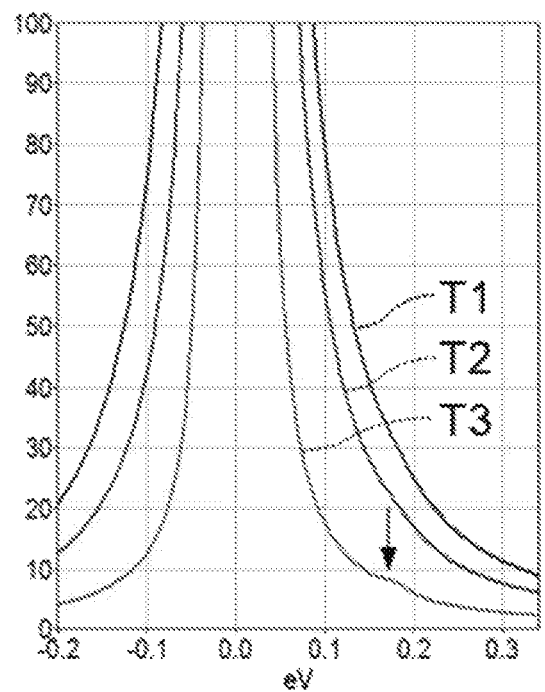
FIG. 3C shows a 100x re-scaled view of the subject of FIG. 3B.

In FIG. 3C, the scaling ("zoom") has been increased by a factor of 100 relative to FIG. 3B. Note that a slight bump (see arrow) is now visible on the right flank of curve T3, but is not (readily) visible on curves T1 and T2. The bump is due to a boron nitride phonon at an energy of 0.17 eV. It has become visible on curve T3 because, in accordance with the present disclosure, lowering the source operating temperature has increased the energy resolution to a level sufficient to reveal this fine feature, which is essentially "lost" in the tails of peaks T1 and T2. In contrast, the higher operating temperature and attendant higher intensity associated with peak T1, for example, would be more suited to relatively fast acquisition of a CLP spectrum (not shown), which would take significantly longer at source operating temperature T3. The source operating temperature can thus be selected to best match the task at hand.

Figure 3D:
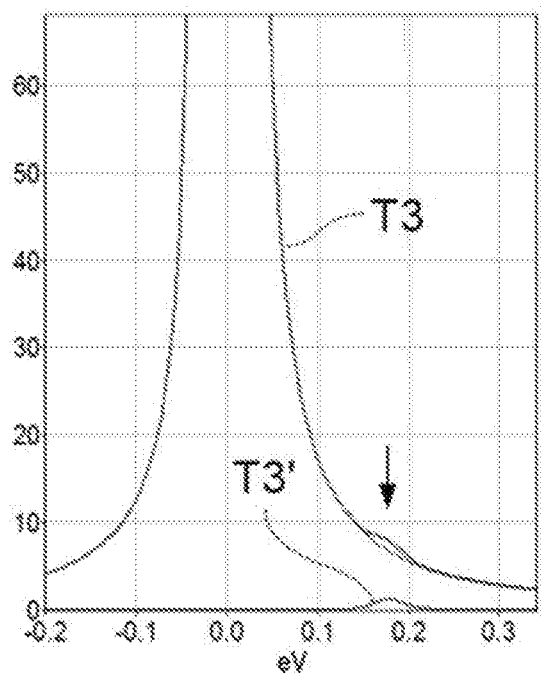
FIG. 3D highlights a detail of FIG. 3C.

In FIG. 3D, the phonon bump is more clearly visible on top of the interpolated tail of the peak T3. Also, curve T3' clearly shows the bump after subtraction of the ZLP on which it is seated.

It should be noted that the irradiating beam (probe) does not actually have to impinge upon a boron nitride particle in order to produce a phonon. Rather, it is sufficient if the beam passes in very close proximity to the particle in which case an electron in the beam can interact with the boron nitride via exchange of virtual photons. This is sometimes referred to as operation in "aloof mode."

For further illustration and explanation of the present disclosure, an electron in the irradiating beam experiences Coulomb forces due to the surrounding electrons in the beam. The Coulomb forces can be described as the combination of an average space charge and individual statistical interactions. The average space charge leads to a predictable defocus, which can, in principle, be corrected by refocusing the beam. The statistical interactions are unpredictable, and therefore cannot be (readily) corrected, and this tends to introduce loss of resolution in the monochromator.

The statistical interactions have transversal and longitudinal components. The transversal components cause random trajectory displacements, resulting in so-called stochastic blur. This blur increases the apparent source size and, as a consequence, reduces the monochromator resolution. The longitudinal components broaden the energy distribution of the electrons, which can be referred to as the Boersch effect. The energy resolution of the monochromatized EM will be reduced if the Boersch effect occurs inside or beyond the monochromator.

For the majority of the electron-electron interactions, the distance between two neighboring electrons in the beam will be relatively large (i.e., the same order of magnitude as the diameter of the electron beam, e.g., a few tens of micrometers) and the corresponding Coulomb deflections will be small. Such small deflections may broaden the energy width of the beam by, for example, a factor of two. However, a small number of electrons will interact at very close separation (in which case it may be more appropriate to say that these electrons are effectively colliding), and this can cause a significant exchange of energy between these electrons.

Accordingly, this small number of electrons can cause a small but long "tail" in the distribution of electron energies in the illuminating beam.

In accordance with the present disclosure, decreasing the source operating temperature causes a decrease in beam current, with an attendant decrease in electron-electron reaction probability. This decrease in electron-electron reaction probability may significantly curtail the abovementioned "tail", and increases attainable resolution for fine intermediate features that sit on the flanks of the ZLP, that would otherwise be swamped by this tail. When examining CLPs, a higher source operating temperature can be employed (leading to shorter acquisition times), since these features are not hampered to any great extent by the ZLP tail.

Figure 4:
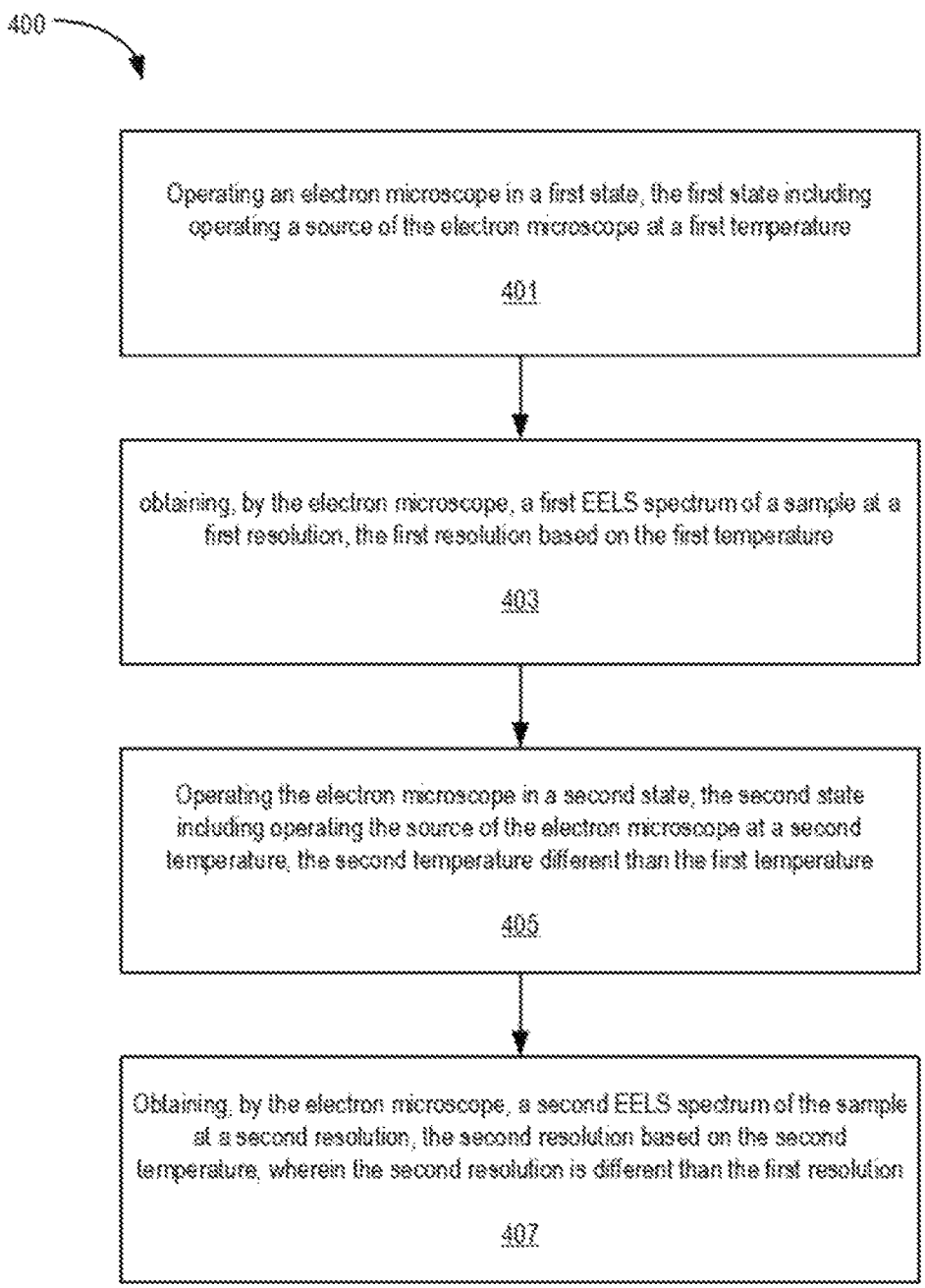
FIG. 4 is an example method flow chart in accordance with an embodiment of the present disclosure.

FIG. 4 is an example method 400 for dual state operation of an electron microscope in accordance with at embodiment of the present disclosure. The method 400, for example, may be implemented by the charged particle microscope M of FIG. 1. The method 400 may provide one technique to obtain CLP spectrums of a sample using an EELS imaging system and to also obtain spectrum of intermediate features of the sample with the EELS system. Operating a source of the microscope at the reduced temperature may provide an enhancement in the obtainable resolution due to reductions in Coulomb interactions between electrons provided by the source. The reduction in Coulomb interactions may reduce an amount of spread of energy in the irradiating electron beam, resulting in the increase in resolution.

The method 400 may begin at step 401, which includes operating the electron microscope in a first state, e.g., a first use session. The first state of operation including operating the source at a first temperature. In some embodiments, the first temperature may be a high temperature, such as in a range of 1700 to 1900 Kelvin. Of course, in other embodiments, the first temperature may be a low temperature, such as in a range of 1400 to 1500 Kelvin. However, other temperatures and temperature ranges are also contemplated herein and covered by the present disclosure. In general, the operating temperature of the source in an operational state is chosen based on a desired resolution of an obtained spectrum, such as an EELS spectrum.

The step 401 may be followed by the step 403, which includes obtaining a first EELS spectrum of a sample at a first resolution, the first resolution based on the first temperature. As noted, the temperature of the source may affect the resolution obtained, which may be affected by Coulomb forces present in the irradiating electron beam.

The step 403 may be followed by the step 405, which includes operating the electron microscope in a second state, e.g., a second use session. The second state including operating the source at a second temperature, which is different than the first temperature. The second temperature will in general be different than the first temperature. For example, if the first temperature is chosen as a high temperature, e.g., 1700-1900K, then the second temperature will be chosen to be a low temperature, e.g., 1400-1500K. Of course, the opposite selections may also be implemented. The order of the selected temperatures is no limiting.

The step 405 may be followed by the step 407, which includes obtaining a second EELS spectrum at a second resolution. The second resolution may be different than the first resolution, and may also be based on the second temperature. As discussed, a low second temperature may provide a higher resolution spectrum, whereas a higher second temperature may provide a lower resolution spectrum.

In some embodiments, the method 400 may be implemented to obtain a CLP spectrum of a sample using a source at a high temperature, and then a spectrum of intermediate features may be obtained using a source at a low temperature. The reduction in source temperature may increase the resolution of the scan due to a decrease in Coulomb interactions in the irradiating electron beam. The reduction in Coulomb interactions may reduce the energy spread of the electron beam, which may reduce the tail of the CLP spectrum and uncover the intermediate features that may otherwise be buried in the tail of the CLP sprectrum.

What is claimed is:

1. A method comprising:
    operating an electron microscope in a first state, the first state including operating a source of the electron microscope at a first temperature;
    obtaining, by the electron microscope, a first EELS spectrum of a sample at a first resolution, the first resolution based on the first temperature;
    operating the electron microscope in a second state, the second state including operating the source of the electron microscope at a second temperature, the second temperature different than the first temperature; and
    obtaining, by the electron microscope, a second EELS spectrum of the sample at a second resolution, the second resolution based on the second temperature, wherein the second resolution is different than the first resolution.

2. The method of claim 1, wherein the first temperature is greater than the second temperature, and wherein the first resolution is lower than the second resolution.

3. The method of claim 2, wherein the first temperature is in a range of 1700 to 1900 Kelvin, and the second temperature is in a range of 1400 to 1500 Kelvin.

4. The method of claim 2, wherein the first resolution is in a range of 30 to 50 meV, and the second resolution is less than 20 meV.

5. The method of claim 1, wherein obtaining a first EELS spectrum of a sample at a first resolution includes obtaining core loss peak spectrum of the sample, and
    wherein obtaining a second EELS spectrum at a second resolution comprises obtaining at least one of a plasmon peak, EELS phonon peak, and EELS bang gap spectrum of the sample.

6. The method of claim 1, wherein operating the electron microscope in the first state comprises:
    irradiating the sample with a first electron beam, the first electron beam generated based on the source operating at the first temperature, and
    wherein obtaining a first EELS spectrum at the first resolution comprises:
    providing the first electron beam to an electron energy loss spectrometer after traversing the sample.

7. The method of claim 1, wherein operating the electron microscope in the second state comprises:
    irradiating the sample with the second electron beam, the second electron beam generated based on the source operating at the second temperature, and
    wherein obtaining a second EELS spectrum at the second resolution comprises:
    providing the second electron beam to an electron energy loss spectrometer after traversing the sample.

8. The method of claim 1, wherein operating the electron microscope in the second state includes reducing Coulomb interactions between electrons emitted by the source based on the source operating at the second temperature.

9. The method of claim 1, wherein operating the source at the first temperature causes the source to operate at a first beam current, and wherein operating the source at the second temperature causes the source to operate at a second beam current, the second beam current different than the first beam current.

10. The method of claim 9, wherein the second beam current is less than the first beam current.

11. An electron microscope comprising:
a source coupled to produce an electron beam;
an illuminator coupled to direct the electron beam to irradiate a specimen, the illuminator including a monochromator coupled to affect an energy spread of the electron beam;
an imaging system coupled to receive a flux of electrons transmitted through the specimen and direct the flux of electrons to a sensing device after having been transmitted through the specimen; and
a controller at least coupled to the source and the imaging system, the controller is programmed to automatically:
adjust the source to a first temperature, and obtain a first EELS spectrum of the sample at a first resolution, the first resolution based on the first temperature; and
adjust the source to a second temperature, and obtain a second EELS spectrum of the sample at a second resolution, the second resolution based on the second temperature, and wherein the second resolution is different than the first resolution.

12. The electron microscope of claim 11, wherein the first temperature is greater than the second temperature, and wherein the first resolution is lower than the second resolution.

13. The electron microscope of claim 12, wherein the first temperature is in a range of 1700 to 1900 Kelvin, and the second temperature is in a range of 1400 to 1500 Kelvin.

14. The electron microscope of claim 12, wherein the first resolution is in a range of 30 to 50 meV, and the second resolution is less than 20 meV.

15. The electron microscope of claim 11, wherein obtain a first EELS spectrum of a sample at a first resolution includes obtain core loss peak spectrum of the sample, and wherein obtain a second EELS spectrum at a second resolution comprises obtain at least one of a plasmon peak, EELS phonon peak, and EELS bang gap spectrum of the sample.

16. The electron microscope of claim 11, wherein the controller is further programmed to:
after adjusting the source to the first temperature, irradiate the sample with a first electron beam, the first electron beam generated based on the source operated at the first temperature, and
wherein obtain a first EELS spectrum at the first resolution comprises:
provide the first electron beam to an electron energy loss spectrometer after traversing the sample.

17. The electron microscope of claim 11, wherein the controller is further programmed to
after adjusting the source to the second temperature, irradiate the sample with a second electron beam, the second electron beam generated based on the source operating at the second temperature, and
wherein obtain a second EELS spectrum at the second resolution comprises:
provide the second electron beam to an electron energy loss spectrometer after traversing the sample.

18. The electron microscope of claim 11, wherein the controller is programmed to adjust the source to the second temperature includes the controller is programmed to reduce Coulomb interactions between electrons emitted by the source based on the source operating at the second temperature.

19. The electron microscope of claim 11, wherein the controller is programmed to adjust the source to the first temperature to cause the source to operate at a first beam current, and wherein the controller is programmed to adjust the source to the second temperature to cause the source to operate at a second beam current, the second beam current different than the first beam current.

20. The electron microscope of claim 19, wherein the second beam current is less than the first beam current.

* * * * *